US006963215B1

(12) United States Patent
Mastrapasqua

(10) Patent No.: US 6,963,215 B1
(45) Date of Patent: Nov. 8, 2005

(54) OPERATION OF SEMICONDUCTOR DEVICES SUBJECT TO HOT CARRIER INJECTION

(75) Inventor: Marco Giuseppe Mastrapasqua, Annandale, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/898,792

(22) Filed: Jul. 26, 2004

(51) Int. Cl.[7] .............................................. G01R 31/26
(52) U.S. Cl. ...................................................... 324/766
(58) Field of Search ................................ 324/765, 766, 324/158.1, 768, 769; 438/14, 15, 16, 17; 702/182; 714/47

(56) References Cited

U.S. PATENT DOCUMENTS

| | | | | |
|---|---|---|---|---|
| 5,822,717 | A * | 10/1998 | Tsiang et al. | 702/108 |
| 6,825,684 | B1 * | 11/2004 | Kim et al. | 324/765 |
| 6,856,160 | B1 * | 2/2005 | Kim et al. | 324/766 |

OTHER PUBLICATIONS

G. Cao et al., "Hot Carrier Injection in Step-Drift RF Power LDMOSFET," talk presented at the IEEE Int. Reliability Physics Symposium IRPS, Session 5 (Transistors II), Presentation 5.4 (Apr. 25-29, 2004); corresponding paper found at IEEE website (without pagination) in May 2004 and (with IEEE IRPS Proceedings citation, pp. 283-287) in Jul. 2004.

Wikipedia, The Free Encyclopedia, "Probability density function," pp. 1-2 (Jul. 21, 2004), found at website URL: http://en.wikipedia.org/wiki/Probability_density_function.

* cited by examiner

*Primary Examiner*—Vinh Nguyen
*Assistant Examiner*—Tung X. Nguyen

(57) ABSTRACT

Given a set of hot carrier stress data measured at a fixed level of an operating parameter (e.g., $V_{DS}$), my invention predicts what the overall hot carrier stress will be when the same operating parameter is dynamically varied in time pursuant to a predetermined function. One embodiment of my invention is a method of operating a semiconductor device (e.g., a LDMOS FET) that is subject to hot carrier injection (HCI) and is characterized by a device parameter (e.g., $R_{ON}$; $I_{Dq}$) and a dynamically varied operating parameter (e.g., $V_{DS}$, $V_{GS}$) comprising the steps of: (a) determining a device parameter that is a measure of the performance of the device; (b) determining the desired lifetime of the device based on an acceptable level of degradation of the device parameter; (c) determining the stress history of the device, including whether or not the device has been previously stressed by HCI; (d) determining the function that describes how the operating parameter is dynamically varied during operation of the device; (e) determining the HCI-induced changes in the device parameter when the operating parameter is fixed in time; (f) based on the stress history of step (c), the function of step (d), and the HCI-induced changes of step (e), determining the HCI-induced degradation of the device parameter; and (g) operating the device with the function if the degradation of step (f) is not greater than the acceptable level of step (b).

8 Claims, 8 Drawing Sheets

OPERATION OF SEMICONDUCTOR DEVICES SUBJECT TO HOT CARRIER INJECTION

BACKGROUND OF THE INVENTION

1. Field of the Invention

This invention relates to semiconductor devices that are subject to hot carrier stress during their operation and, more particularly, to lateral diffused metal-oxide-semiconductor field effect transistors (LDMOS FETs) that are subject to hot carrier injection (HCI).

2. Discussion of the Related Art

Some MOSFET semiconductor devices, especially radio frequency (RF) LDMOS FETs of the type shown in FIG. 1, are operated at relatively high powers, which may cause energetic charged carriers (i.e., electrons, holes) to be injected from the drain into/through the gate oxide, a phenomenon known as HCI. Charge trapped in the gate oxide has several possible adverse effects including drift of the operating current (e.g., the quiescent drain current, $I_{Dq}$) and restriction of the voltage/current sweep range. In particular, trapped charge can cause degradation of the saturation current, transconductance, threshold voltage and on-resistance ($R_{ON}$). As a result, power capability decreases during the lifetime of RF amplifiers that employ such LDMOS FETS.

Thus, the stress induced by HCI is an important consideration in determining the reliability of semiconductor devices such as LDMOS FETS.

The problem is complicated by recent RF amplifier designs in which efficiency is improved by operating schemes that dynamically vary the drain bias; that is, the drain bias, instead of being maintained constant in time, is controllably varied according to a predetermined function (e.g., a probability density function).

A need remains in the art for a technique that predicts the effects of hot carrier stress under dynamic or variable drain bias conditions.

BRIEF SUMMARY OF THE INVENTION

In accordance with one aspect of my invention, I am able to predict, given a set of hot carrier stress data measured at a fixed level of an operating parameter (e.g., $V_{DS}$), what the overall hot carrier stress will be when the same operating parameter is dynamically varied in time pursuant to a predetermined function. In one embodiment of my invention, a method of operating a semiconductor device (e.g., a LDMOS FET) that is subject to hot carrier injection (HCI) and is characterized by a device parameter (e.g., $R_{ON}$; or $I_{Dq}$) and a dynamically varied operating parameter (e.g., $V_{DS}$, or $V_{GS}$) comprises the steps of: (a) determining a device parameter that is a measure of the performance of the device; (b) determining the desired lifetime of the device based on an acceptable level of degradation of the device parameter; (c) determining the stress history of the device, including whether or not the device has been previously stressed by HCI; (d) determining the function (e.g., an envelope tracking function) that describes how the at least one operating parameter will be dynamically varied during operation of the device; (e) determining the HCI-induced changes in the device parameter when the operating parameter is fixed in time; (f) based on the stress history of step (c), the function of step (d), and the HCI-induced changes of step (e), determining the HCI-induced degradation of the device parameter; and (g) operating the device with the function if the HCI-induced degradation is not greater than the acceptable level.

For an LDMOS FET manufacturer to determine the requisite device lifetime of step (b), or the requisite function of step (d), in some cases entails nothing more than obtaining the lifetime or function information from the manufacturer's customers who use the devices in their own equipment (e.g., RF amplifiers or systems).

My invention provides an important advantage to such customers. Without it they have to use trial and error to determine the proper level of the operating parameter; that is, they would have to choose the function of step (d), stress the LDMOS FETs operated according to the chosen function, and then characterize the HCI-induced degradation. Any change in the function would require that the entire characterization process be repeated, a time consuming and expensive process. Instead, starting from a simple characterization of the HCI-induced stress for fixed values of the operating parameter, my invention enables such customers and/or the LDMOS FET manufacturer itself, to predict the proper level of the operating parameter that will satisfy the device lifetime given any operating parameter function of step (d).

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

LDMOS FET Structure

Figure 1:
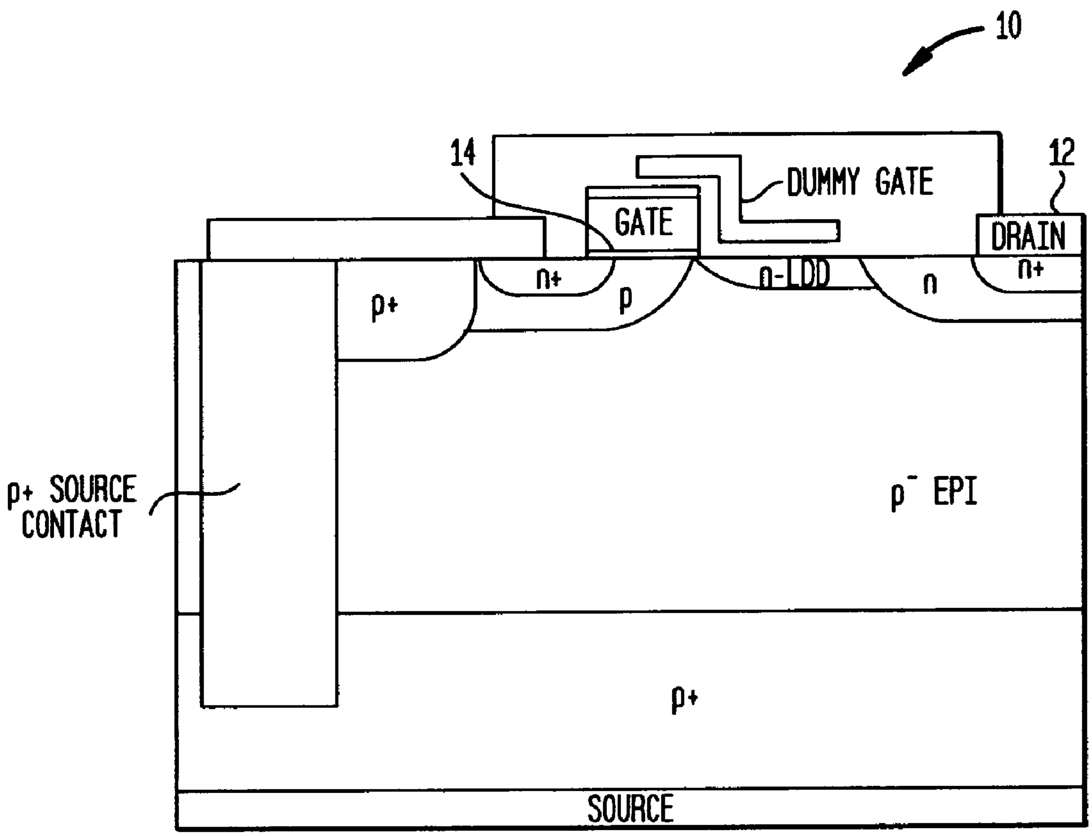
FIG. 1 is a schematic, cross-sectional view of a prior art LDMOS FET.

A commercially available LDMOS FET 10 is shown schematically in FIG. 1. When operated under high power conditions, typical of RF amplifier applications, a relatively high electric field in the drain region 12 causes electrons to be injected into the gate oxide 14, a phenomenon known as hot carrier injection (HCI). Electrons trapped in the gate oxide can have several deleterious effects on device parameters including, for example, degradation of the on-resistance ($R_{ON}$) and drift of the quiescent drain current ($I_{Dq}$). Of the two, I believe that degradation of $R_{ON}$ is the more demanding condition to control. The problem of controlling such degradation can be complicated by certain operating parameter schemes; for example, dynamic drain bias schemes, which are used in the art to improve the efficiency of LDMOS FET RF amplifiers. In such schemes, LDMOS FETs are operated so that their DC drain bias is a function of the envelope of the RF signal. In such cases the DC bias may vary, for example, at a MHz rate whereas the RF signal may vary at a GHz rate.

My invention relates to predicting the effects of HCI-induced stress that result when the drain bias (e.g., $V_{DS}$) is dynamic (i.e., variable in time). However, we lay the foundation for dynamic bias by first considering the case of fixed bias.

HCI-Induced Stress Analysis for Constant Bias

The following analysis considers how the degradation of $R_{ON}$ is affected by HCI-induced stress under constant or fixed drain bias. A similar analysis would apply to the degradation of other device parameters, such as $I_{Dq}$, and to schemes involving other operating parameters, such as $V_{GS}$.

In the analysis that follows the following assumptions have been made: (1) any increase in $R_{ON}$ is proportional to the damage created by HCI; (2) the damage follows a power-law with the exponent independent of $V_{DS}$ and less than one; (3) the rate of damage is a function of the already existing damage; (4) damage is created equally by different $V_{DS}$; and (5) damage is cumulative.

Under these assumptions consider how to combine stress at different levels of $V_{DS}$. $R_{ON}$ degradation is proportional to the damage, D, created by HCI, and it follows a power law:

$$D=A(V_{DS})t^B \quad (1)$$

where A is constant in time but a function of $V_{DS}$, but B is constant in time and in $V_{DS}$.

Experimentally I have observed that (1) B=0.4 and is constant with changes in $V_{DS}$; (2) $A(V_{DS}=36V)=0.1$; and (3) $A(V_{DS}=22V)=0.01$. These observations were made using LDMOS FETs of the type shown in FIG. 1 and manufactured by Agere Systems Inc., Allentown, Pa.

The rate of damage (Rd) is given by $$R_d=dD/dt=A(V_{DS})Bt^{B-1} \quad (2)$$

The damage created for HCI-induced stress at $V_{DS}$ for a time t is given by:

$$D=\int_{t_{vg}}^{t_{vg}+t} A\,B\,t^{B-1}\,dt \quad (3)$$

where $t_{vg}$ is the stress time at $V_{DS}$ that would have caused, in a virgin device, damage equivalent to the already pre-existing damage.

Consider now the problem of binomial stress; that is, the total damage after stress of a virgin device for a time $t_1$ at $V_{DS1}$ followed by stress for a time $t_2$ at $V_{DS2}$ is given by:

$$D=\int_0^{t_1} A_1\,B\,t^{B-1}\,dt+\int_{t_{vg}}^{t_{vg}+t_2} A_2\,B\,t^{B-1}\,dt \quad (4)$$

where $t_{vg}$ is the stress time at $V_{DS2}$ that would have caused damage equivalent to the damage created by stress at $V_{DS1}$ for a time $t_1$; that is, using equation (1) the problem is stated as:

$$A_1t_1^B=A_2t_{vg}^B \quad (5a)$$

Therefore, $$t_{vg}(A_1/A_2)^{1/B}t_1 \quad (5b)$$

Consequently, $$D=A_2(t_{vg}+t_2)^B=(A_1^{1/B}t_1+A_2^{\ 1/B}t_2) \quad (6)$$

It can be demonstrated that the same total damage is produced (1) by first applying $V_{DS2}$ for a time $t_2$ followed by $V_{DS1}$ for a time $t_1$, or (2) by cycling the total stress time $t_1+t_2$ between $V_{DS1}$ and $V_{DS2}$ provided the ratio $t_1/t_2$ is maintained.

Figure 2:
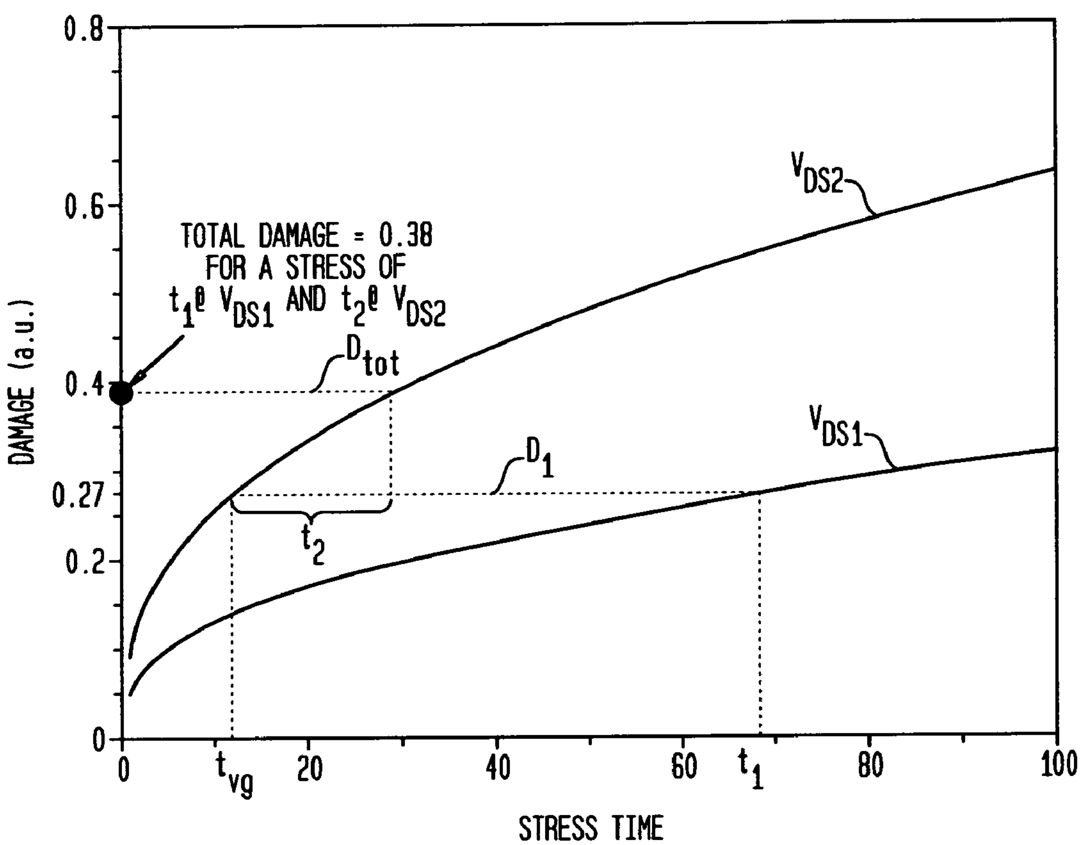
FIG. 2 is a graph showing how hot carrier damage varies in an LDMOS FET with stress time at different fixed source-to-drain voltages ($V_{DS}$)

FIG. 2 is a graphical representation of this binomial stress principle under the conditions that both $V_{DS}$ and $V_{GS}$ are fixed in time during each stress interval $t_1$ and $t_2$. Thus, the lower non-linear curve represents the damage produced by stress at $V_{DS1}$, whereas the upper non-linear curve represents damage caused by stress at $V_{DS2}$. In this illustration, after stress at $V_{DS1}$ for a time $t_1$, the damage is $D_1$~0.27 a.u. (arbitrary units), which corresponds to the damage that would be caused in a virgin device stressed at $V_{DS2}$ for a time $t_{vg}$ of about 12 units of time. Thus, starting at the point $(t_{vg}, D_1)$, stress at $V_{DS2}$ for a time $t_2$ produces a total damage $D_{tot}$~0.38. As used herein, the term virgin device means that it has been previously unstressed; that is, not probed, not tested, not operated in any fashion that would cause HCI-induced damage. Because the damage is not linear in time, any predictions of damage levels must take into account the stress history of a device. In particular, the damage experienced by a virgin device will be different from that experienced by a previously stressed, but otherwise identical, device.

Figure 3:
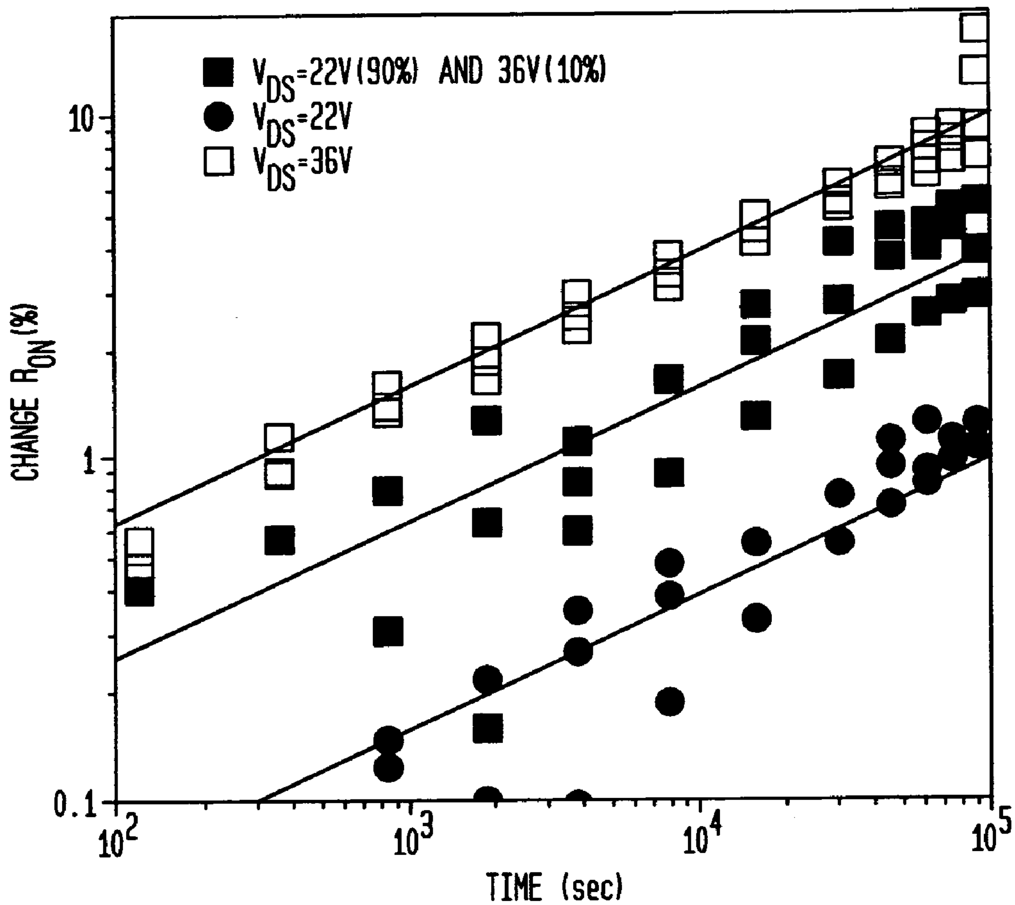
FIG. 3 is a graph showing how the percent change in on-resistance ($R_{ON}$) varies in an LDMOS FET with time at different $V_{DS}$ but with the same $I_{Dq}$ for each $V_{DS}$.

FIG. 3 shows data from an experiment on LDMOS FETs of the type shown in FIG. 1 that verifies the above principles of binomial stress in virgin devices by measuring the percent change in $R_{ON}$ at fixed $V_{GS}$ for several cases: (1) $V_{DS}$=22V (90% of the stress time) and $V_{DS}$= 36V (10% of the stress time); (2) $V_{DS}$=22V (100% of the stress time); and (3) $V_{DS}$=36V (100% of the stress time). In this log-log plot the upper line is a power-law, hand-drawn fit to measured data for case (3); the lower line is a power-law, hand-drawn fit to measured data for case (2); and the middle line is calculated based on equation (6) for case (1).

Note, if the analysis were to ignore the fact that the damage rate is function of pre-existing damage, the resulting damage would be seriously overestimated.

$$D=\int_0^{t_1} A_1\,Bt^{B-1}\,dt+\int_0^{t_2} A_2Bt^{B-1}\,dt \tag{6a}$$

Equation (6a) is incorrect because, in the case $V_{DS1}=V_{DS2}=V_{DS}$ and $t_1=t_2$, it would predict a damage greater than the damage for uninterrupted stress at $V_{DS}$ for a time equal of $2t_1$; to wit, $$D=2\int_0^{t_1} A_1\,B\,t^{B-1}\,dt=2At_1^B>A(2t_1)^B \tag{6b}$$

Figure 3A:
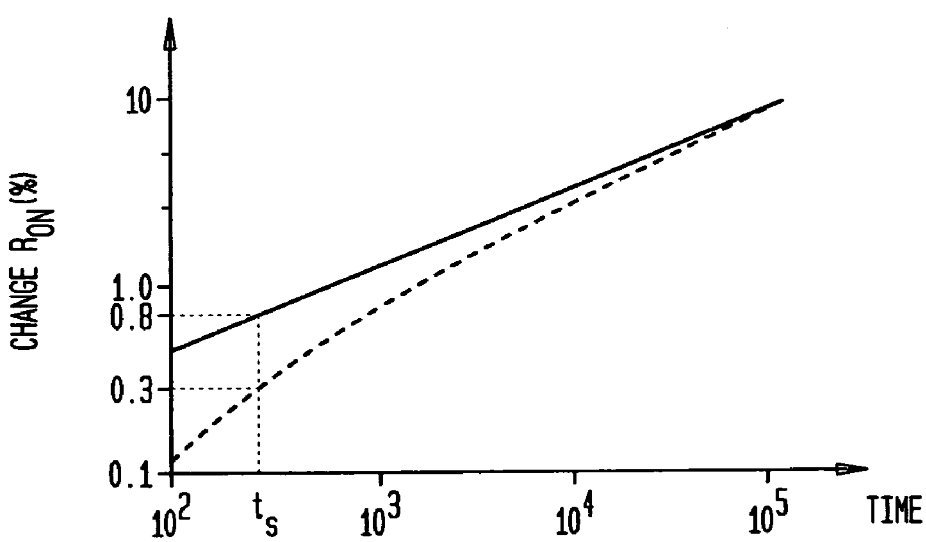
FIG. 3A is a schematic version of FIG. 3.

FIG. 3A schematically illustrates the problem of overestimation. The upper line represents a linear dependence of the logarithm of the change of $R_{ON}$ with the logarithm of time for a virgin device, whereas the lower curve represents a non-linear dependence between these two parameters for a previously stressed device. For a given stress time $t_5$, the upper line predicts an 0.8% change in $R_{ON}$ for a virgin device, whereas the lower curve predicts an 0.3% change in $R_{ON}$ for a previously stressed device. The key is to know whether or not a device has been previously stressed, and then to take that fact in account. Otherwise, predictions of damage will be inaccurate.

HCI-Induced Stress Analysis for Variable Bias

For RF amplifier designs in which $V_{DS}$ is variable [i.e., $V_{DS}$ follows an arbitrary function in time, or equivalently an arbitrary voltage probability density (VPD)] the binomial stress model is extended as follows. Calculate the degradation after a time to for a variable $V_{DS}$ bias between voltages $V_{DS1}$ and $V_{DS2}$ with a given voltage probability density function P(V):

$$D(t_0)=\int_{V_1}^{V_2} d[D(V),\,V,\,dt_v] \tag{7}$$

Because of the cumulative nature of the damage, the final degradation is the integral over the voltage range of the degradation in a given dV interval. Here, $dt_v=t_0P(V)dV$ is the time the device spends at a voltage V; and d[D(V), V, dtV] is the degradation caused by stress for a time $dt_v$, spent at a voltage V, which includes the already existing damage produced in reaching the voltage V.

Extension of the model to an arbitrary VPD involves the following calculations:

$$D(t_0)=D(t)+d[D(V),\,V,\,dt_v]+\int_{V+dV}^{V_2} d[D(V),\,V,\,dt_v] \tag{8}$$

$$d[D(V),\,V,\,dt_v]=\int_{t^*}^{t^*+dt_v} BA(V)t^{B-1}\,dt \tag{9}$$

where $$t^*=[D(t)/A(V)]^{1/B} \tag{10}$$

therefore $$d[D(V),\,V,\,dt_v]=A(V)(t^*+dt_v)^B-D(t) \tag{11}$$

and $$D(t_0)=A(V)(t^*+dt_v)^B+\int_{V+dV}^{V_2} d[D(V),\,V,\,dt_v] \tag{12}$$

Inasmuch as the coefficients B and A(V) are derived from stress measurements performed at fixed $V_{DS}$, these equations demonstrate that the HCI-induced damage at dynamic bias can be predicted from data taken at fixed bias.

In summary, in a typical business scenario the lifetime specifications placed on RF equipment/systems that incorporate LDMOS FETs dictate an acceptable level of degradation of at least one device parameter (e.g., $R_{ON}$) of the FET. On the other hand, the operating conditions (e.g., $V_{DS}$, $V_{GS}$) determine the amount of HCI-induced degradation that the FET will experience. In the case of a variable operating parameter (e.g., $V_{DS}$ of an envelope-tracking scheme discussed infra) the operating parameter is not represented by a single, fixed number but by a VPD. Using equation (12) and degradation based on a fixed operating parameter (e.g., voltage bias), my invention predicts the HCI-induced degradation for a given VPD.

Equation (12) can be readily calculated numerically as follows: D(t)=0 and for $V_1<V<V_2$:

$$dt_v=t_0P(V)dV \tag{13}$$

$$t^*=[D(t)/A(V)]^{1/B} \tag{14}$$

$$D(t)=A(V)\,(t^*+dt_v)^B \tag{15}$$

Using standard, well-known numerical analysis techniques, equations (13), (14) and (15) represent programming lines within the loop of a computer code. Starting with D(t)=0 and $V=V_1$, at each cycle of the loop V=V+dV, and the loop is repeated until $V>V_2$. The result is the numerical calculation of equation (12).

Figure 4:
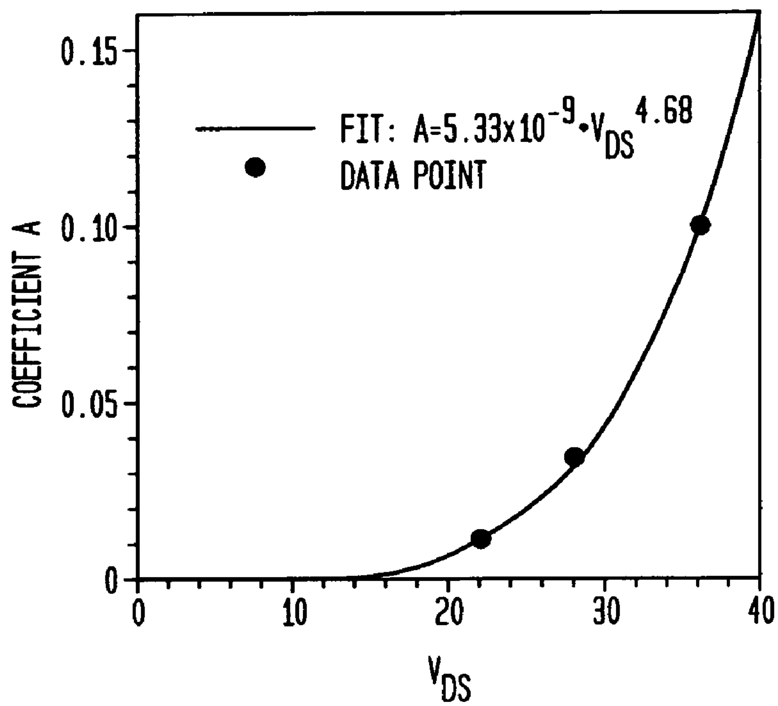
FIG. 4 is a graph showing how the coefficient A varies with $V_{DS}$ for $R_{ON}$ degradation.

In order to calculate $D(t_0)$ using equations (12)–(15), one must know A(V). In particular, FIG. 4 shows how the coefficient A varies with $V_{DS}$ for LDMOS FETs of the type shown in FIG. 1. The fit to experimental data indicates that $$A=5.33\ 10^{-9}V_{DS}^{4.68} \tag{16}$$

Figure 5:
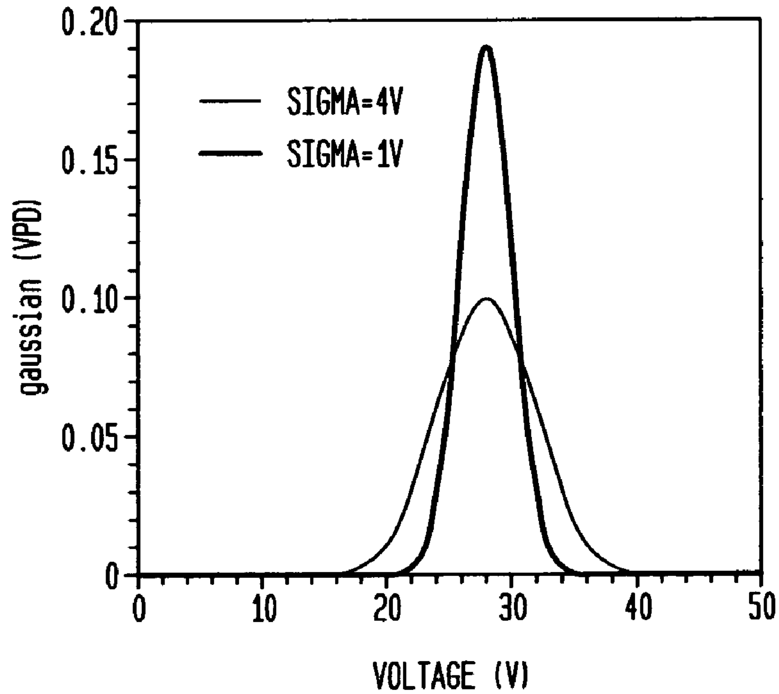
FIG. 5 is a graph showing a Gaussian voltage probability density (VPD) of $V_{DS}$.
Figure 6:
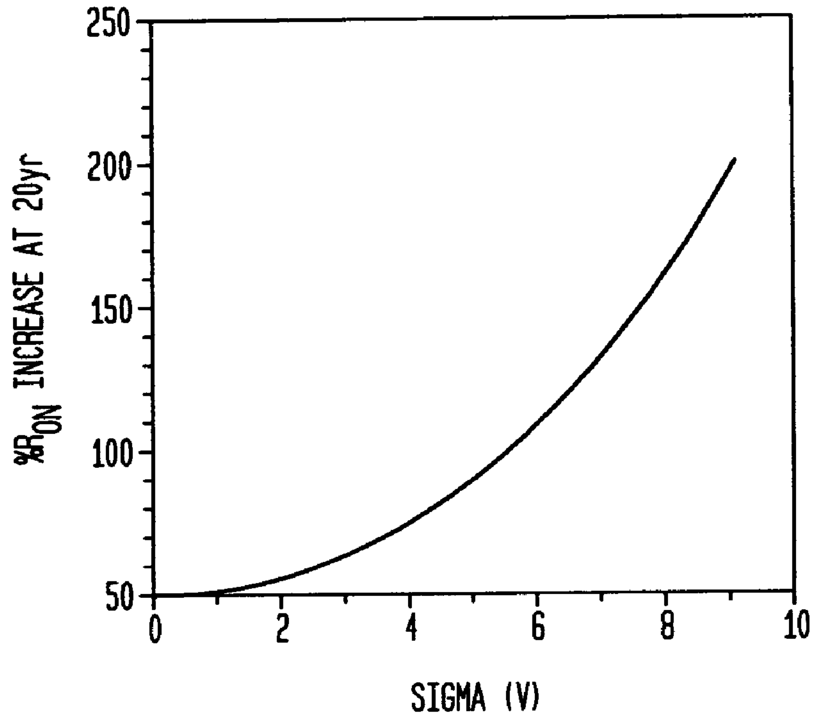
FIG. 6 is a graph showing the total HCI-induced degradation for a Gaussian VPD, as demonstrated by the percent increase in $R_{ON}$ at 20 yr.

To illustrate how HCI degradation affects $R_{ON}$ at 20 yr under conditions of dynamic drain bias, consider first the relatively simple case where the VPD of $V_{DS}$ is a Gaussian probability density function centered at 28V, as shown in FIG. 5. Two cases are illustrated: the taller/narrower Gaussian probability density function represents the case of standard deviation (sigma)=1V, whereas the shorter/broader density function represents the case of sigma=4V. (Of course, a Gaussian VPD with sigma=0 would be equivalent to fixed bias, as defined earlier.) The resulting total HCI-induced degradation of $R_{ON}$ as a function of sigma is shown in FIG. 6. The curves demonstrate that only when sigma is greater than ~2V, does the total HCI-induced degradation for a Gaussian VPD differ from the 28V DC degradation by more than 10%.

Note, the choice of 20 yr is illustrative only, but it is a common value used by equipment (e.g., RF amplifier) manufacturers who incorporate LDMOS FETs into their designs.

The principles used to analyze the relatively simple Gaussian VPDs, as shown in FIG. 5, can be applied to somewhat more complex Gaussian-like VPDs, such as those employed in the CDMA IS-95 standard, which is referred to as simply IS-95 hereinafter. (CDMA is an acronym for Code Division Multiple Access.)

Figure 7:
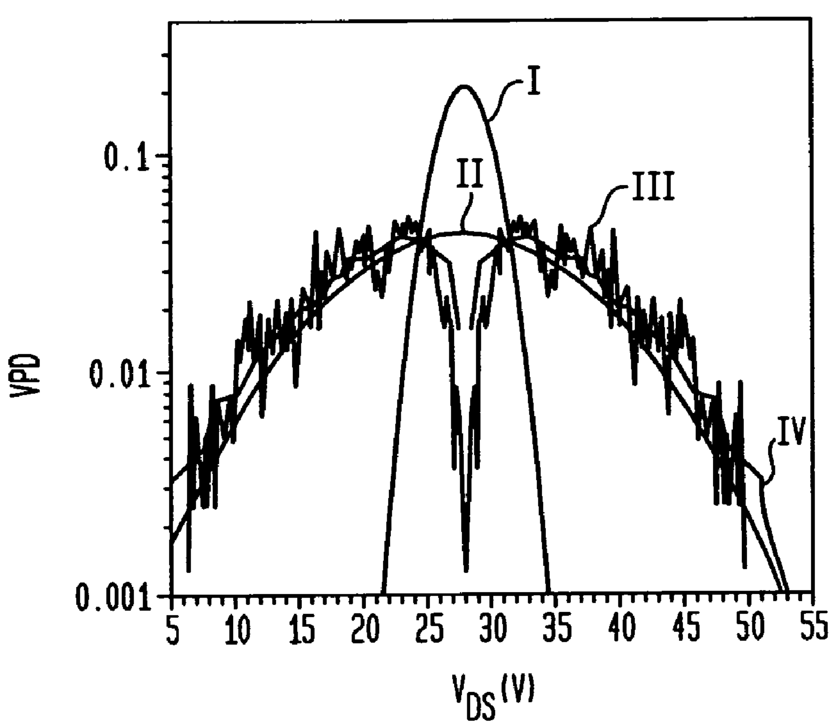
FIG. 7 is a graph showing the VPD of $V_{DS}$ for various cases: VPD-I is the case for $\sigma=2$; VPD-II is the case for $\sigma=9$; VPD-III and VPD-IV are cases for signals that conform to the IS-95 standard. For example, VPD-IV was calculated using a MATLAB programming package (commercially available from The MathWorks, Inc. whose headquarters is located in Natick, Mass.). More specifically, these programs were used to generate the envelope waveform describing an IS-95 signal containing the pilot, page, sync and six traffic channels. The signal, created according to the well-known standard, included short and long (spreading and encryption) codes, Walsh (orthogonal) codes for the individual channels, base-band filter (48 taps), as well as the equalization filter in the downlink. The voltage and power probability density functions were generated from sampled portions of the composite signal.

The $V_{DS}$ VPD function for IS-95 (except for the dip at 28V) is similar to a Gaussian with sigma of about 9V. More specifically, as shown in FIG. 7, curve I is a Gaussian VPD with a sigma of about 2, and curve II is a Gaussian VPD with a sigma of about 9. On the other hand, curve III and curve IV are both similar to Gaussian-like VPDs with sigma of about 9.

Figure 8:
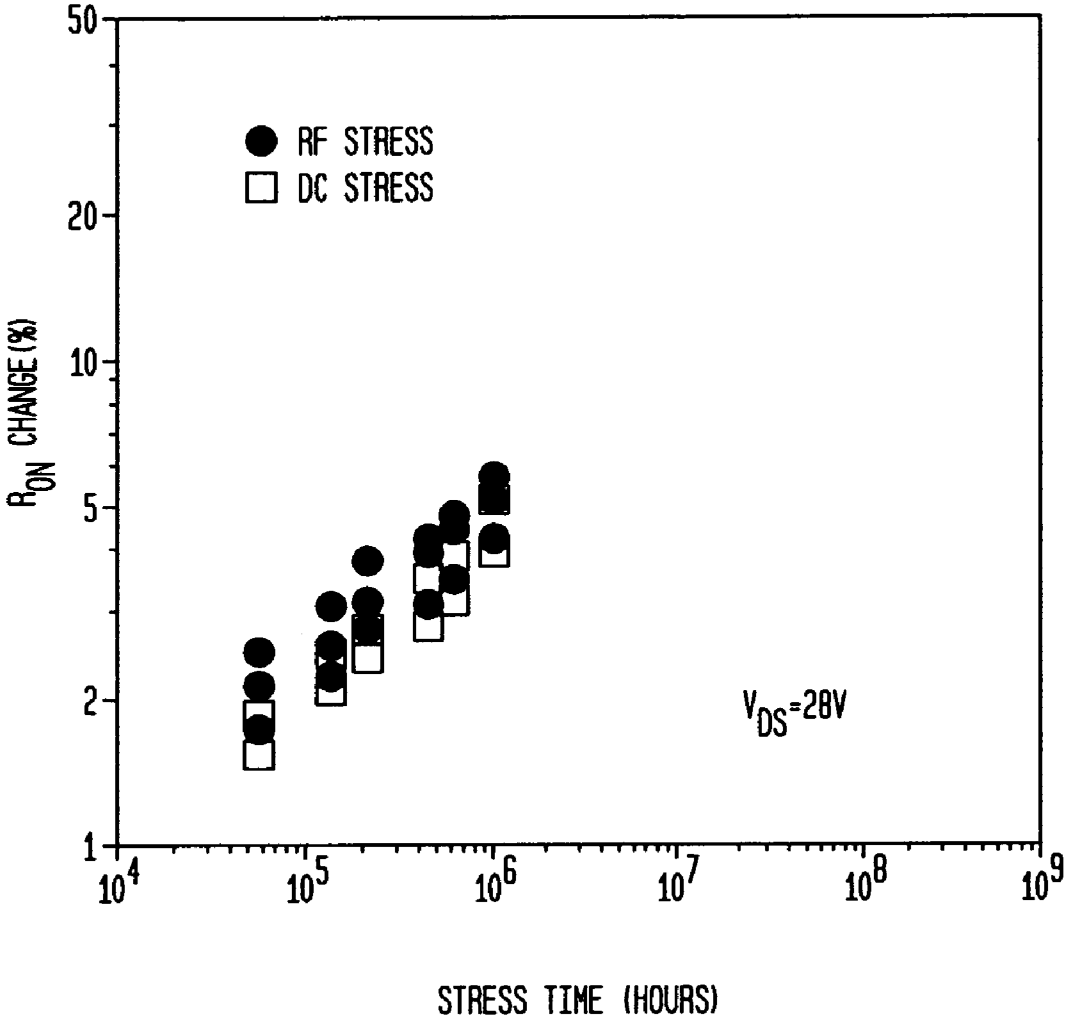
FIG. 8 is a graph showing percent change in $R_{ON}$ with stress for both RF (IS-95) stress and DC stress at fixed $V_{DS}$=28 V.

Using curves III and IV as the VPDs of IS-95, the $R_{ON}$ degradation at 20 yr was calculated based on the previously described model [(i.e., equation (12)] on which my invention is based. The calculations indicate that the $R_{ON}$ degradation under RF conditions (i.e., variable $V_{DS}$) was four times that under DC conditions. However, this result is not consistent with measurement data (FIG. 8) that show no significant difference in $R_{ON}$ degradation between DC and RF stress at $V_{DS}$=28V. (Similar results are expected at other values of $V_{DS}$.) The discrepancy can be explained in several ways: (1) the model assumes that the stress at different $V_{DS}$ always occurs under conditions of fixed $V_{GS}$, whereas under RF operation higher $V_{DS}$ occurs at gate biases different from the gate bias at $I_{Dq}$; (2) under RF operation the device could be at high $V_{DS}$ with gate bias below threshold but supplying high current through parasitic capacitance (e.g., $C_{GS}$ and $C_{DG}$); and (3) obviously, when the device is in an off state, no HCI-induced degradation takes place.

Figure 9:
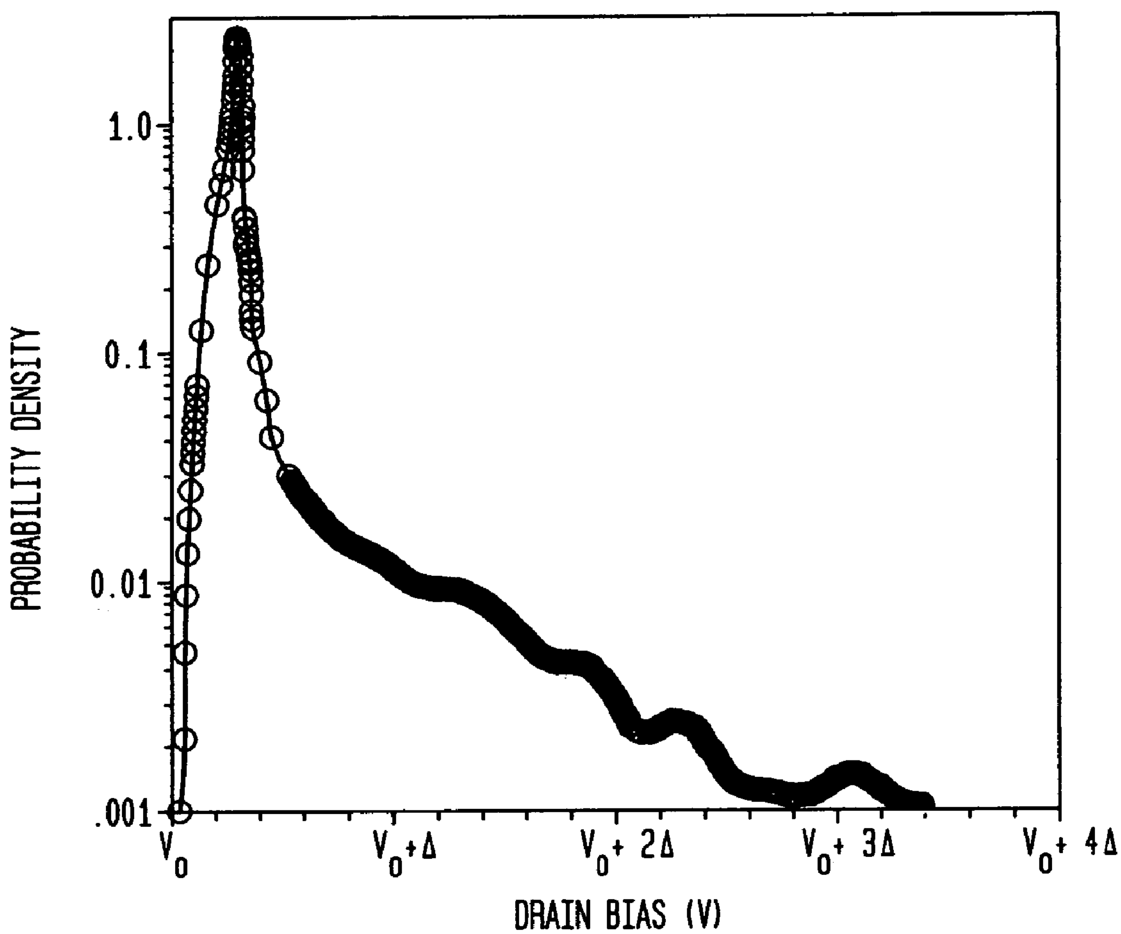
FIG. 9 is a graph showing an exemplary VPD for $V_{DS}$ ranging from $V_0$ to $(V_0+N\Delta)$, where N=0, 1, 2, 3, 4 and $\Delta$ is any voltage interval. The ordinate is the probability density P(V), which means that P(V)dV is the probability that a certain voltage will occur in the interval between V and (V+dV). P(V)dV must be less than one for every V, and the integral from minus infinity to plus infinity of P(V)dV has to be equal to one. (Note, the VPD for the case of fixed V is a delta function.) See, the Wikipedia website at http://en.wikipedia.org/wiki/Probability_density_function.

As the above illustration of stress under IS-95 conditions indicates, the model to predict HCI-induced stress under conditions of variable $V_{DS}$ is applicable only when $V_{DS}$ is changed while maintaining $V_{GS}$ constant or nearly constant. Variable $V_{DS}$ and essentially fixed $V_{GS}$ are indeed the case for certain RF envelope tracking (ET) schemes used to increase the efficiency of RF amplifiers. In an illustrative ET scheme, $V_{DS}$ tracks the envelope of the RF signal, while the DC gate bias ($V_{GS}$) is kept essentially constant, which means that $I_{Dq}$ is also essentially constant. FIG. 9 shows the VPD for the drain bias ($V_{DS}$) of an illustrative ET scheme.

Note, an LDMOS FET is biased at a true DC value (i.e., a single fixed voltage level), and then the RF signal is applied to the gate. The RF signal causes the drain bias seen by the device to modulate at an RF frequency around the true DC value. In an ET scheme, as mentioned earlier, the DC bias is not a single, fixed voltage level; rather it changes at, for example, a MHz frequency as it tracks the envelope of the RF signal. Nevertheless, my invention is equally applicable to the case of dynamically varying DC bias as it is for fixed DC bias.

Figure 10:
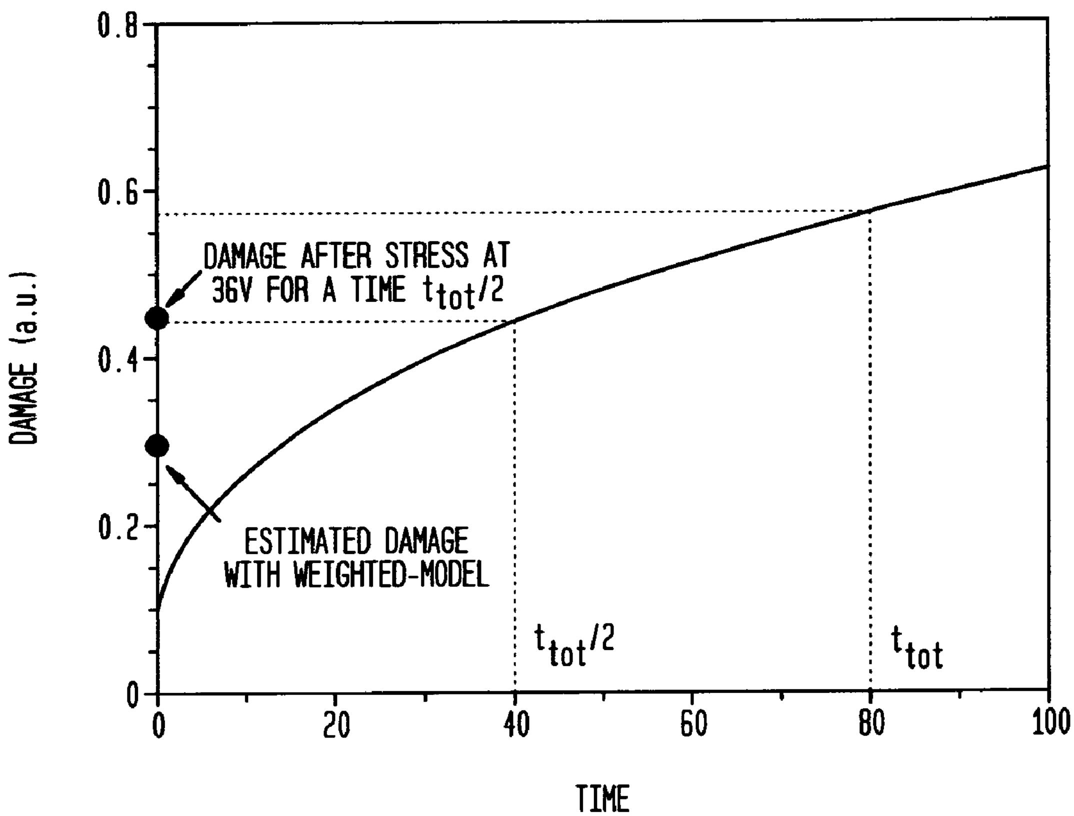
FIG. 10 is a graph showing the variation of HCI-induced damage with time for a weighted scheme in which an LDMOS FET is biased for half the total time, $t_{tot}$, at $V_{DS}$=0V and half the time at $V_{DS}$=36V.

In evaluating such an ET scheme, if the total HCI-induced degradation were to be calculated by integrating the curve of damage vs. $V_{DS}$ weighted by the VPD of $V_{DS}$(using the same concept of binomial stress described above in conjunction with FIG. 2), the result would be correct only if the HCI-induced degradation were linear with time. However, the HCI-induced degradation of both $R_{ON}$ and $I_{Dq}$ has been experimentally found to be non-linear and a function of pre-existing stress, both of which tend to decrease the rate of damage. For example, let us assume that damage is linear with time within the context of a weighted scheme in which an LDMOS FET device is biased for 50% of the total time, $t_{tOt}$, at $V_{DS}$=0V and 50% of the time at $V_{DS}$=36V. Because no stress is associated with $V_{DS}$=0V, based on the above assumptions, the total HCI-induced damage would be half of the damage measured after a time $t_{tOt}$ at $V_{DS}$=36V. However, because HCI-induced damage actually varies sub-linearly with time, this assumption would result in an under-estimate of the damage measured after a time $t_{tOt}/2$ at $V_{DS}$=36 V. FIG. 10 is a graphical representation of this example, which shows (1) a damage level of about 0.28 a.u. using the weighted model and assumed linear dependence, and (2) a damage level of about 0.44 using my model and verified sub-linear dependence. Thus, the estimate of 0.28 a.u. is more than 57% low.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

I claim:

1. A method of operating a semiconductor device that is subject to hot carrier injection (HCI) and is characterized by at least one device parameter and at least one dynamically varied operating parameter, said method comprising the steps of:

(a) determining at least one of said device parameters that is a measure of the performance of said device;

(b) determining the desired lifetime of said device based on an acceptable level of degradation of said at least one device parameter;

(c) determining the stress history of said device, including whether or not said device has been previously stressed by HCI;

(d) determining the function that describes how said at least one operating parameter is dynamically varied during operation of said device;

(e) determining the HCI-induced changes in said at least one device parameter when said at least one operating parameter is fixed in time;

(f) based on said stress history of step (c), said function of step (d), and said HCI-induced changes of step (e), determining the HCI-induced degradation of said at least one device parameter; and (g) operating said device with said function if said degradation of step (f) is not greater than said acceptable level of step (b).

2. The method of claim 1, wherein said device comprises an LDMOS FET.

3. The method of claim 2, wherein said at least one device parameter is the on-resistance of said LDMOS FET.

4. The method claim 2, wherein another of said device parameters is the quiescent drain current of said LDMOS FET.

5. The method of claim 2, wherein said at least one operating parameter is the gate-to-source voltage of said LDMOS FET.

6. The method of claim 1, wherein said at least one operating parameter is the drain-to-source voltage of said LDMOS FET.

7. The method of claim 2, wherein said LDMOS FET is included in an RF amplifier.

8. A method of operating an LDMOS FET that is subject to hot carrier injection (HCI) and is characterized by an on-resistance, a gate-to source voltage and a drain-to-source voltage, said method comprising the steps of:

(a) determining that said on-resistance is a measure of the performance of said FET;

(b) determining the desired lifetime of said FET based on an acceptable level of degradation of said on-resistance;

(c) determining the stress history of said FET, including whether or not said FET has been previously stressed by HCI;

(d) determining the function that describes how drain-to-source voltage is dynamically varied during the operation of said FET;

(e) determining the HCI-induced changes in said on-resistance when said drain-to-source voltage and said gate to source voltage are fixed in time;

(f) based on said stress history of step (c), said function of step (d), and said HCI-induced changes of step (e), determining the HCI-induced degradation of said on-resistance; and (g) operating said FET with said function if said degradation of step (f) is not greater than said acceptable level of step (b).

* * * * *